(12) United States Patent
Kohda et al.

(10) Patent No.: US 7,885,303 B2
(45) Date of Patent: Feb. 8, 2011

(54) NITRIDE SEMICONDUCTOR LASER DEVICE AND METHOD OF MANUFACTURING THE SAME

(75) Inventors: Shinichi Kohda, Kyoto (JP); Yuji Ishida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 31 days.

(21) Appl. No.: 12/344,352

(22) Filed: Dec. 26, 2008

(65) Prior Publication Data

US 2009/0180505 A1 Jul. 16, 2009

(30) Foreign Application Priority Data

Dec. 28, 2007 (JP) .............................. 2007-340212

(51) Int. Cl.
*H01S 5/00* (2006.01)
(52) U.S. Cl. ............... 372/43.01; 372/44.01; 372/45.01
(58) Field of Classification Search ............. 372/43.01, 372/45.01
See application file for complete search history.

(56) References Cited

U.S. PATENT DOCUMENTS

| | | | | |
|---|---|---|---|---|
| 6,281,526 | B1 * | 8/2001 | Nitta et al. ................. 257/103 |
| 7,009,218 | B2 * | 3/2006 | Sugimoto et al. ............. 257/99 |
| 2003/0067950 | A1 | 4/2003 | Hanaoka | |
| 2004/0159836 | A1 * | 8/2004 | Sugimoto et al. ............. 257/40 |
| 2004/0164308 | A1 | 8/2004 | Asatsuma et al. | |
| 2004/0183155 | A1 * | 9/2004 | Seto et al. ................... 257/529 |
| 2005/0025204 | A1 * | 2/2005 | Kamikawa et al. ............ 372/43 |
| 2005/0025205 | A1 * | 2/2005 | Ryowa et al. ................. 372/44 |
| 2005/0141577 | A1 * | 6/2005 | Ueta et al. .................... 372/43 |
| 2006/0084245 | A1 | 4/2006 | Kohda | |
| 2006/0091417 | A1 * | 5/2006 | Sugimoto et al. ............. 257/99 |
| 2007/0131960 | A1 * | 6/2007 | Ohmi et al. ................. 257/103 |
| 2010/0014550 | A1 * | 1/2010 | Hasegawa et al. ........ 372/49.01 |

FOREIGN PATENT DOCUMENTS

| | | |
|---|---|---|
| JP | 2004-047675 | 2/2004 |
| JP | 2007-048938 | 2/2007 |

\* cited by examiner

*Primary Examiner*—Minsun Harvey
*Assistant Examiner*—Phillip Nguyen
(74) *Attorney, Agent, or Firm*—Rabin & Berdo, P.C.

(57) ABSTRACT

A nitride semiconductor laser device is formed by growing a group III nitride semiconductor multilayer structure on a substrate. The group III nitride semiconductor multilayer structure has a laser resonator including an n-type semiconductor layer, a p-type semiconductor layer and a light emitting layer held between the n-type semiconductor layer and the p-type semiconductor layer. The laser resonator is arranged to be offset from the center with respect to a device width direction orthogonal to a resonator direction toward one side edge of the device. A wire bonding region having a width of not less than twice the diameter of an electrode wire to be bonded to the device is formed between the laser resonator and the other side edge of the device.

14 Claims, 10 Drawing Sheets

NITRIDE SEMICONDUCTOR LASER DEVICE AND METHOD OF MANUFACTURING THE SAME

BACKGROUND OF THE INVENTION

1. Field of the Invention

The present invention relates to a method for manufacturing a nitride semiconductor laser device having a structure obtained by forming an n-type semiconductor layer, a light emitting layer and a p-type semiconductor layer (all made of group III nitride semiconductors, for example) on a group III nitride semiconductor substrate. The group III nitride semiconductors are group III-V semiconductors employing nitrogen as a group V element, and typical examples thereof include aluminum nitride (AlN), gallium nitride (GaN) and indium nitride (InN), which can be generally expressed as $Al_xIn_yGa_{1-x-y}N$ ($0 \leq x \leq 1$, $0 \leq y \leq 1$ and $0 \leq x+y \leq 1$).

2. Description of Related Art

A semiconductor light-emitting device having a structure obtained by growing group III nitride semiconductor layers on a GaN substrate is known in general, and typical examples thereof include a blue light-emitting diode and a semiconductor laser. A semiconductor laser includes group III nitride semiconductor layers provided in a multilayer structure formed by successively stacking an n-type AlGaN cladding layer, an n-type GaN guide layer, an active layer (light emitting layer), a p-type GaN guide layer, a p-type GaN electron blocking layer, a p-type AlGaN cladding layer and a p-type GaN contact layer from a side closer to a GaN substrate, for example. The active layer has a multiple quantum well structure obtained by alternately repetitively stacking quantum well layers formed by InGaN layers and barrier layers formed by non-doped GaN layers, for example. According to this structure, electrons and positive holes are recombined in the active layer, to emit light. The emission wavelength can be adjusted by adjusting the In composition in the quantum well layers.

SUMMARY OF THE INVENTION

While semiconductor crystals having low dislocation densities are necessary for manufacturing a semiconductor laser, the dislocation density of a nitride semiconductor substrate is too excessive to manufacture a semiconductor laser. Therefore, there is proposed a technique of intentionally concentrating dislocations through epitaxial lateral overgrowth in crystal growth on the nitride semiconductor substrate. Thus, nitride semiconductor layers can be formed so that high dislocation density regions and low dislocation density regions alternately periodically appear. In relation to this, there is proposed a technique of periodically preparing low dislocation regions in a striped manner and forming a semiconductor laser structure on any of these low dislocation density regions. In this case, a laser resonator is generally formed on the center of the striped low dislocation density region in the width direction.

However, the width of the striped low dislocation density region is so small that a bonding wire may be bonded to an upper portion of the laser resonator in connection by wire bonding. Thus, the resonator structure may be damaged, to deteriorate the characteristics of the device. Particularly when the high dislocation density regions are eliminated from a chip so that the chip is constituted of only the low dislocation density regions, the chip size is reduced. Therefore, it is difficult to ensure a region for wire bonding on a side portion of the laser resonator arranged at the center, and there is a strong possibility that the bonding wire is bonded onto the laser resonator.

In order to die-bond the chip, external force for the die bonding must be applied to a peripheral portion of the chip while avoiding the laser resonator, in order not to damage the resonator structure. Therefore, it is difficult to uniformly press the overall chip. This inhibits improvement of the yield in the assembling steps.

Accordingly, an object of the present invention is to provide a nitride semiconductor laser device capable of suppressing damage applied to a laser resonator in wire bonding and also capable of contributing to improvement of the yield in the assembling steps and a method of manufacturing the same.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
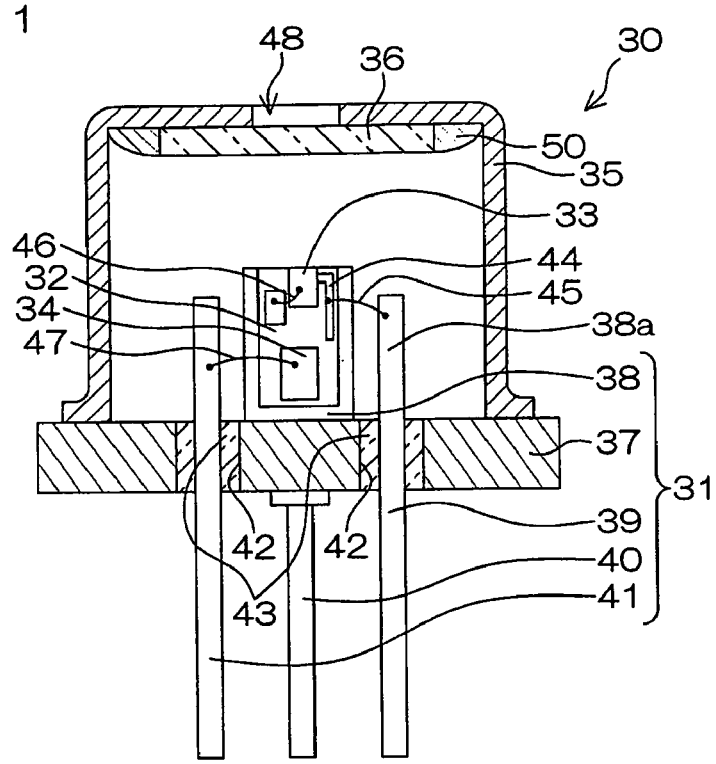
FIG. 1 is a schematic longitudinal sectional view for illustrating the structure of a semiconductor laser according to an embodiment of the present invention.

A nitride semiconductor laser device according to an embodiment of the present invention is a nitride semiconductor laser device formed by growing a group III nitride semiconductor multilayer structure on a substrate, and the group III nitride semiconductor multilayer structure has a laser resonator including an n-type semiconductor layer, a p-type semiconductor layer and a light emitting layer (containing In, for example) held between the n-type semiconductor layer and the p-type semiconductor layer. The laser resonator is arranged to be offset from the center with respect to a device width direction orthogonal to a resonator direction toward one side edge of the device. A wire bonding region having a width of not less than twice the diameter of an electrode wire to be bonded to the device is formed between the laser resonator and the other side edge of the device.

When an electrode wire is bonded onto a device, a ball having a diameter of about four times that of the wire is formed on an end of the electrode wire, and a circular region having a diameter of half that of the ball is bonded to the device. Therefore, the electrode wire and the device are bonded to each other on the circular region having a diameter of about twice that of the wire as a result.

According to this embodiment, the laser resonator is arranged to be offset from the center in the device width direction toward the one side edge of the device. Thus, a wire bonding region having a width of at least twice the diameter of the electrode wire is ensured on the surface of the device between the laser resonator and the other side edge of the device. When the electrode wire is bonded to this wire bonding region, the bonding can be performed without damaging the laser resonator.

When die-bonding the nitride semiconductor laser device, further, the center thereof can be pressed while avoiding the laser resonator. Thus, the overall device can be uniformly pressed, whereby the yield in the assembling steps can be improved.

Preferably, the laser resonator is offset toward the one side edge of the device by a distance of not less than the diameter of the electrode wire. Thus, a wire bonding region having a width of not less than twice the diameter of the electrode wire can be easily ensured.

The substrate may periodically have a region having a first dislocation density and a region having a second dislocation density lower than the first dislocation density on the surface. In this case, the laser resonator is preferably arranged on the region having the second dislocation density. According to this structure, the laser resonator is formed on a low dislocation density region, whereby excellent oscillation efficiency can be implemented, and a nitride semiconductor laser device having a low threshold current density can be obtained. Further, the wire bonding region can be ensured through a high Dislocation density region. Thus, the high dislocation density region is so utilized as the wire bonding region that a laser resonator can be easily formed through the low dislocation density region.

The substrate not yet divided into each device may periodically have a region having a first dislocation density and a region having a second dislocation density lower than the first dislocation density on the surface. In this case, the laser resonator is preferably arranged on the region having the second dislocation density, and the region having the first dislocation density is preferably not included in the device. According to this structure, the device includes no high dislocation density region, whereby superior device characteristics can be implemented.

A metallic pattern for bonding the electrode wire may be formed on the center related to the device width direction orthogonal to the resonator direction. The laser resonator is deviated from the center of the device, whereby the metallic pattern for bonding the electrode wire can be provided on the center in the width direction. Thus, the electrode wire can be stably bonded.

The substrate may be die-bonded to a submount or a stem. According to this structure, the laser resonator is deviated from the center of the device in the width direction, whereby the device can be pressed against the submount or the stem by pressing the center of the device when the device is die-bonded to the submount or the stem. Thus, the overall device can be uniformly pressed against the submount or the stem, whereby the yield in the assembling steps can be improved.

A substrate dividing groove trace may be formed on a side edge of the device. In this case, a device thickness h of the remaining portion excluding the substrate dividing groove trace and a device width W in the direction orthogonal to the resonator direction preferably satisfy $W \geq 1.4\,h$. According to this structure, the device thickness excluding the substrate dividing groove trace is not more than 1/1.4 times the device width, whereby the substrate can be excellently divided. Thus, the device can be reliably divided from the substrate, even if the size thereof is reduced. Consequently, the device can be prevented from fracture when the same is cut out of the substrate, whereby the yield can be improved.

Preferably, the device thickness h of the remaining portion excluding the substrate dividing groove trace is less than 100 µm. According to this structure, the substrate can be more reliably divided, to further contribute to the improvement of the yield.

A nitride semiconductor laser device according to another embodiment of the present invention is a nitride semiconductor laser device formed by growing a group III nitride semiconductor multilayer structure on a substrate, and the group III nitride semiconductor multilayer structure has a laser resonator including an n-type semiconductor layer, a p-type semiconductor layer and a light emitting layer (containing In, for example) held between the n-type semiconductor layer and the p-type semiconductor layer. A substrate dividing groove trace is formed on a side edge of the device, and a device thickness h of the remaining portion excluding the substrate dividing groove trace and a device width W in a direction orthogonal to a resonator direction satisfy $W \geq 1.4\,h$. According to this structure, the device thickness excluding the substrate dividing groove trace is not more than 1/1.4 times the device width, whereby the substrate can be excellently divided. Thus, the device can be reliably divided from the substrate, even if the size thereof is reduced. Consequently, the device can be prevented from fracture when the same is cut out of the substrate, whereby the yield can be improved.

Preferably, the device thickness h of the remaining portion excluding the substrate dividing groove trace is less than 100 µm. According to this structure, the substrate can be more reliably divided, to further contribute to the improvement of the yield.

A method of manufacturing a nitride semiconductor laser device according to an embodiment of the present invention includes the step of forming a group III nitride semiconductor multilayer structure having a laser resonator including an n-type semiconductor layer, a p-type semiconductor layer and a light emitting layer held between the n-type semiconductor layer and the p-type semiconductor layer on a substrate. This method further includes the step of dividing the substrate so that the laser resonator is arranged to be offset from the center with respect to a device width direction orthogonal to a resonator direction toward one side edge of the device, and forming a wire bonding region having a width of not less than twice the diameter of an electrode wire to be bonded to the device between the laser resonator and the other side edge of the device. According to this structure, a nitride semiconductor laser device having the aforementioned structure can be manufactured.

A method of manufacturing a nitride semiconductor laser device according to another embodiment of the present invention includes the step of forming a group III nitride semiconductor multilayer structure having a laser resonator including an n-type semiconductor layer, a p-type semiconductor layer and a light emitting layer held between the n-type semiconductor layer and the p-type semiconductor layer on a substrate. This method further includes the steps of forming a substrate dividing groove on the substrate so that a device thickness h of the remaining portion excluding the substrate dividing groove and a device width W in a direction orthogonal to a resonator direction satisfy $W \geqq 1.4\,h$ and dividing the substrate along the substrate dividing groove.

The substrate dividing groove can be formed by laser machining, scribing with a diamond cutter, or with a dicer. Further, etching (dry etching, for example) may also be employed. For example, a substrate dividing groove consisting of first and second grooves may be formed by forming the first groove by performing etching up to the n-type semiconductor layer and forming the second groove by performing laser machining or the like on the bottom surface of the first groove.

The embodiments of the present invention are now described in detail with reference to the attached drawings.

FIG. 1 is a schematic longitudinal sectional view for illustrating the structure of a semiconductor laser according to a first embodiment of the present invention. This semiconductor laser is a stem-type semiconductor laser employed as a pickup light source or a writing light source for an optical disk or a magnetooptic disk. This semiconductor laser 30 includes a stem 31, a submount 32, a nitride semiconductor laser device 33, a monitoring photodetector 34, a cap 35 and a glass plate 36. The stem 31 has a base portion 37, a heat sink portion 38, leads 39 and 41 and a common lead 40. The base portion 37 and the heat sink portion 38 are integrally formed by a metallic material such as iron or copper, for example. The base portion 37 is molded in the form of a plate (a discoidal plate, for example), and the heat sink portion 38 in the form of a rectangular parallelepipedic block is uprightly provided on the central region of one surface (hereinafter referred to as "upper surface" for the sake of convenience) thereof. The pair of leads 39 and 41 pass through a pair of through-holes 42 formed in the base portion 37 at an interval respectively, and are fixed to the base portion 37 by fixing materials 43 made of an insulating material (soft glass, for example) arranged in these through-holes 42 respectively. The common lead 40 is directly bonded to another surface (hereinafter referred to as "bottom surface" for the sake of convenience) of the base portion 37 by silver brazing or the like.

The heat sink portion 38 has a planar mount surface 38a. The submount 32 is bonded to the mount surface 38a. The submount 32 is formed by a silicon substrate or the like. The semiconductor laser device 33 and the monitoring photodetector 34 are mounted on the submount 32. A back electrode (n-type electrode) of the semiconductor laser device 33 is bonded to a relay portion 44 provided on the surface of the submount 32. The relay portion 44 is connected to the lead 39 by a bonding wire 45 on the upper surface side of the base portion 37. Thus, the back electrode of the semiconductor laser device 33 is electrically connected to the lead 39. Another electrode (p-type electrode) of the semiconductor laser device 33 is connected to the submount 32 through a bonding wire 46 (electrode wire). The submount 32 is electrically connected to the common lead 40 through the heat sink portion 38 and the base portion 37. Therefore, the other electrode of the semiconductor laser device 33 is electrically connected to the common lead 40. The bonding wires 45 and 46 are formed by gold wires, for example.

One electrode of the monitoring photodetector 34 is connected to the lead 41 through a bonding wire 47. Another electrode of the monitoring photodetector 34 is electrically connected to the common lead 40 through the submount 32, the heat sink portion 38 and the base portion 37.

The cap 35 is fixed to the upper surface of the base portion 37, to surround the submount 32, the semiconductor laser device 33, the monitoring photodetector 34, the bonding wires 45 to 47, the heat sink portion 38 and the upper end portions of the leads 39 and 41. A through-hole 48 is formed in the head portion of the cap 35, and a glass plate 36 is arranged in this through-hole 48. The glass plate 36 is fixed to the top face of the cap 35 by a fixing material 50 such as low-melting glass.

A resonator direction of the semiconductor laser device 33 is along a vertical direction perpendicular to the upper surface of the base portion 37, while a light emitting end face is directed toward the through-hole 48. Thus, a laser beam emitted from the semiconductor laser device 33 passes through the glass plate 36 and the through-hole 48, to be emitted from the cap 35 toward the direction perpendicular to the base portion 37. An end face opposite to the light emitting end face is directed to a photoreceiving surface of the monitoring photodetector 34, which in turn receives light leaking out of this end face.

Figure 2:
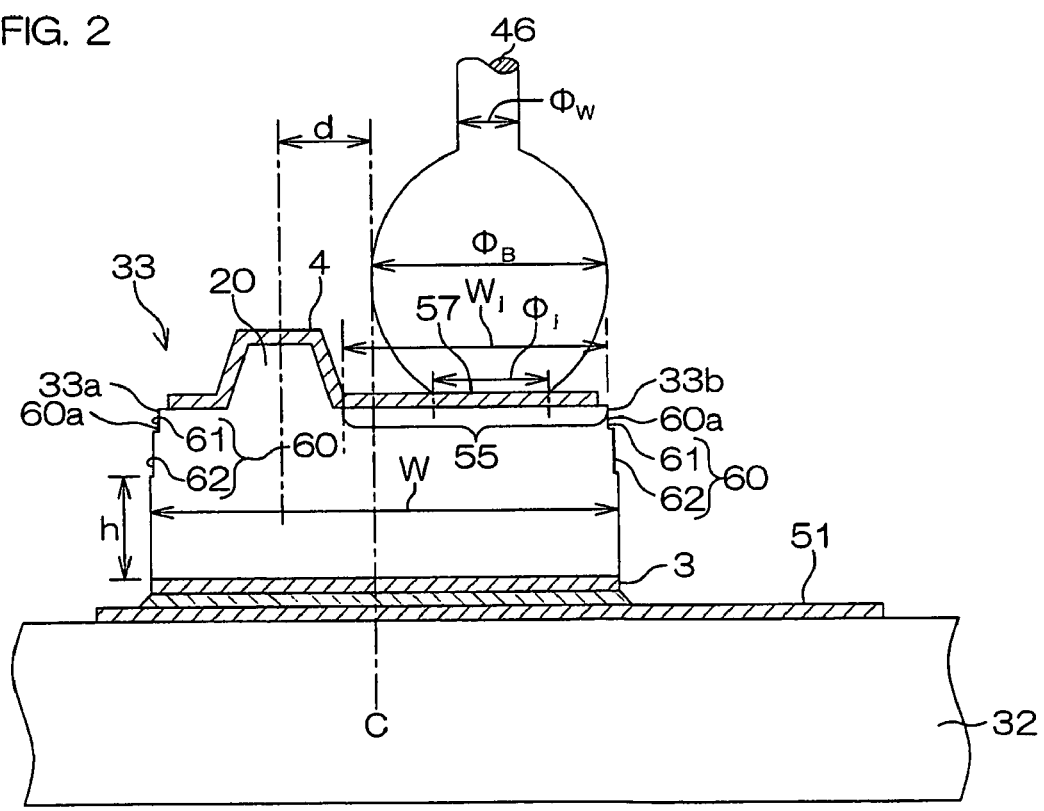
FIG. 2 is a schematic cross sectional view showing the electric connection structure of a semiconductor laser device in an enlarged manner.

FIG. 2 is a schematic cross sectional view showing the electric connection structure of the semiconductor laser device 33 in an enlarged manner. A metal wiring layer 51 is formed on the submount 32, and the relay portion 44 (see FIG. 1) is formed on the submount 32 continuously with the metal wiring layer 51. The semiconductor laser device 33 is die-bonded onto the metal wiring layer 51, whereby an n-type electrode 3 of the semiconductor laser device 33 is connected to the metal wiring layer 51.

A ridge stripe 20 forming a laser resonator is formed on the upper surface side of the semiconductor laser device 33, and a p-type electrode 4 is formed to cover the ridge stripe 20. The p-type electrode 4, referred to as "pad metal", is formed to cover not only the region of the ridge stripe 20 but also planar device surface portions on side portions of the ridge stripe 20. According to this embodiment, the ridge stripe 20 is arranged to be offset from a central position C toward a first side edge 33a of the device by a prescribed offset distance d, in relation to a device width direction (a direction perpendicular to a resonator direction and parallel to the submount 32) of the semiconductor laser device 33. Thus, a wire bonding region 55 for bonding the bonding wire 46 is formed between the ridge stripe 20 and a second side edge 33b of the semiconductor laser device 33. The p-type electrode 4 as the pad metal is formed to cover the wire bonding region 55. The wire bonding region 55 has a width $W_j$.

The wire bonding includes the steps of forming a ball 56 on an end portion of the bonding wire 46 and pressing the formed ball 56 against the p-type electrode 4 as the pad metal and welding the same. The ball 56 has a diameter $\Phi_B$ of about four times the diameter $\Phi_W$ of the bonding wire 46. A junction 57 between the ball 56 and the p-type electrode 4 is a generally circular region having a diameter $\Phi_j$ of about half the ball diameter $\Phi_B$. Therefore, a relation $\Phi_j \approx \Phi_B/2 \approx 2\Phi_W$ holds.

According to this embodiment, the offset distance d is so set that a relation $W_j \geqq 2\Phi_W$ holds as to the width $W_j$ of the wire bonding region 55. If the device width W of the semiconductor laser device 33 is about the ball diameter $\Phi_B$, i.e., when $W \approx \Phi_B$ for example, the offset distance d may be set to not less than the wire diameter $\Phi_W$, i.e., so that $d \geqq \Phi_W$ holds.

Thus, the wire bonding region 55 having the width $W_j$ of not less than twice the wire diameter $\Phi_W$ can be ensured between the ridge stripe 20 and the side edge 33b of the semiconductor laser device 33. This wire bonding region 55 is so ensured that the semiconductor laser device 33 can be wire-bonded without making an impact on the ridge stripe 20.

When the device width W is 100 μm and the wire diameter $\Phi_W$ is 25 μm, for example, the offset distance d is so set to 25 μm that a wire bonding region 55 having a width $W_j$ of 73 μm to 74 μm can be ensured, assuming that the width of the ridge stripe 20 is 1 μm to 3 μm. While the ball diameter $\Phi_B \approx 100$ μm, the diameter $\Phi_j$ of the junction 57≈50 μm, and hence the wire bonding region 55 has a sufficient width. When the value of d/W is increased with respect to the device width W, the width $W_j$ is also increased. For example, d/W may be set so that $d/W \geq 0.18$.

Figure 3:
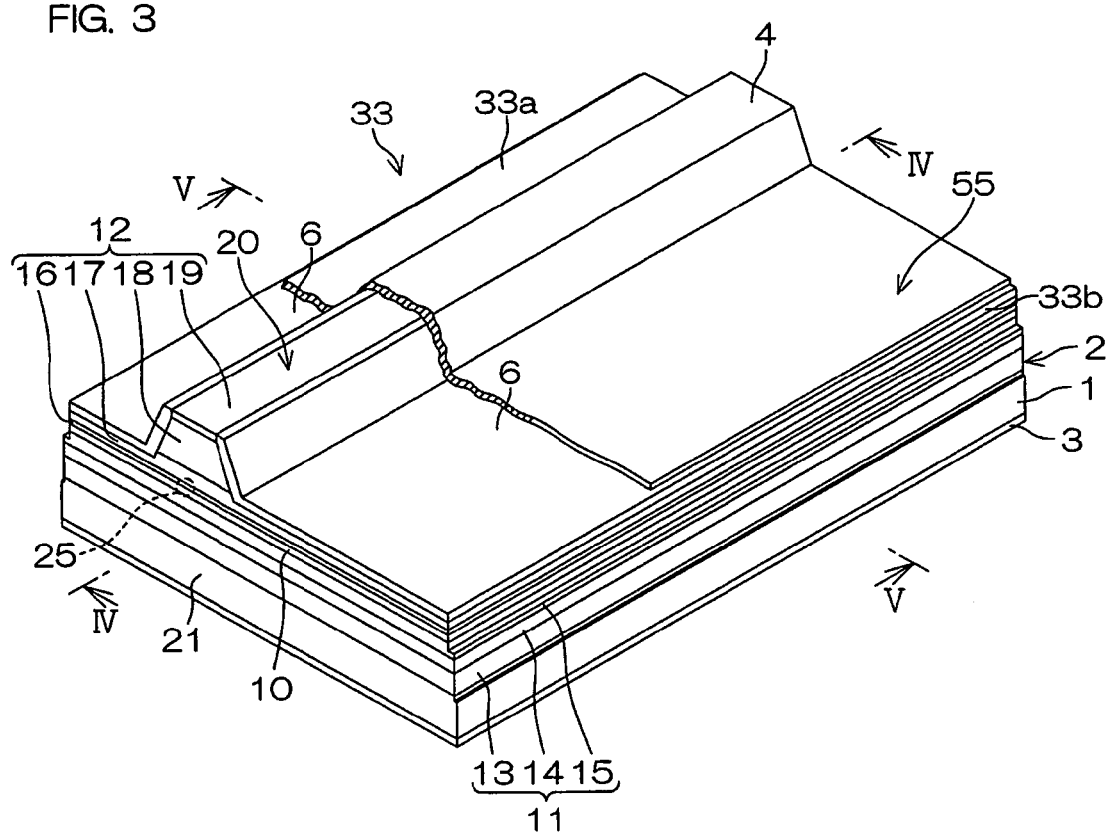
FIG. 3 is a perspective view for illustrating the structure of the semiconductor laser device in more detail.
Figure 4:
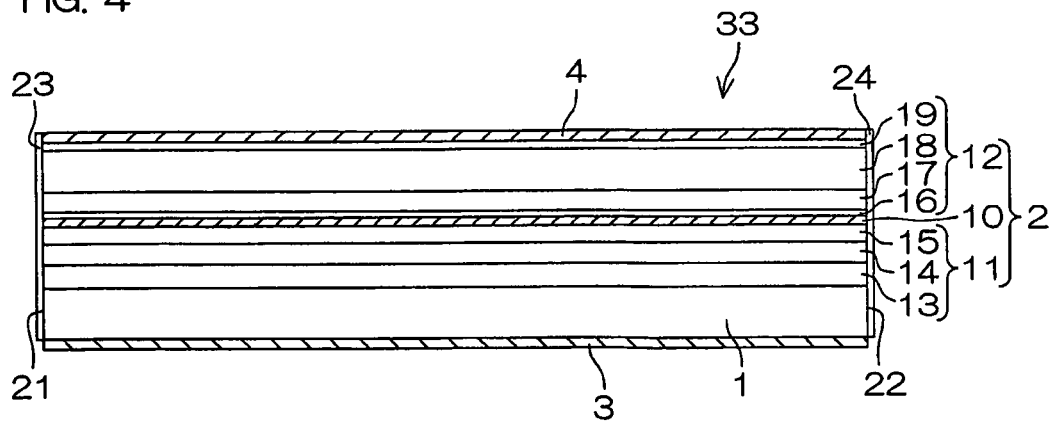
FIG. 4 is a longitudinal sectional view taken along a line IV-IV in FIG. 3.
Figure 5:
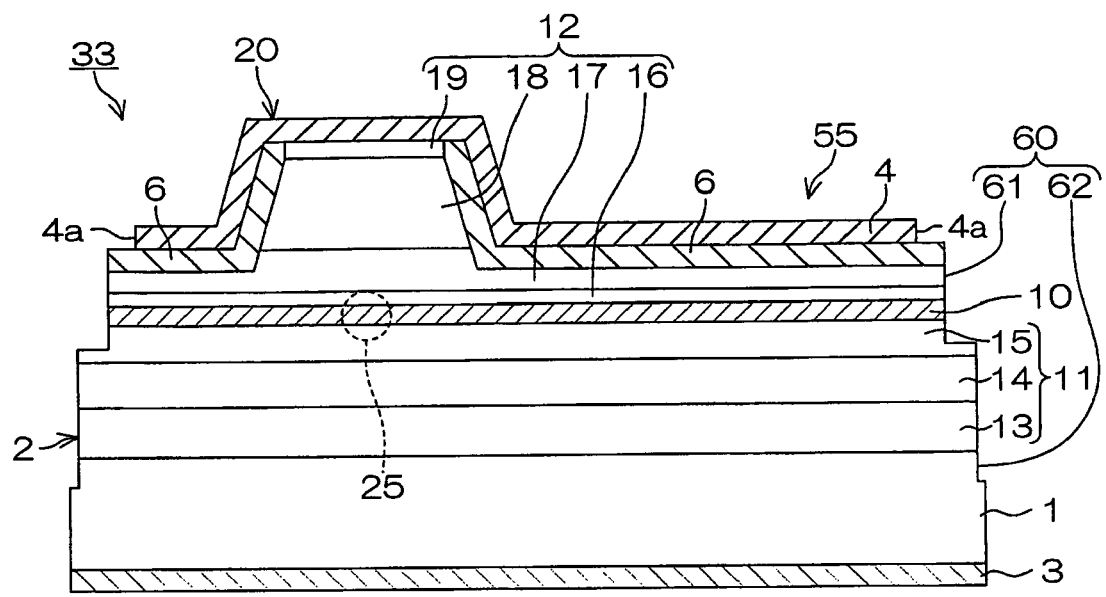
FIG. 5 is a cross sectional view taken along a line V-V in FIG. 3.

FIG. 3 is a perspective view for illustrating the structure of the semiconductor laser device 33 in more detail, FIG. 4 is a longitudinal sectional view taken along a line IV-IV in FIG. 3, and FIG. 5 is a cross sectional view taken along a line V-V in FIG. 3.

This semiconductor laser device 33 is a Fabry-Perot laser device including a group III nitride semiconductor substrate 1, a group III nitride semiconductor multilayer structure 2 (group III nitride semiconductor layers) formed on the group III nitride semiconductor substrate 1 by crystal growth, the n-type electrode 3 formed to be in contact with a back surface (a surface opposite to the group III nitride semiconductor multilayer structure 2) of the group III nitride semiconductor substrate 1 and the p-type electrode 4 formed to be in contact with the surface of the group III nitride semiconductor multilayer structure 2.

According to this embodiment, the group III nitride semiconductor substrate 1 is constituted of a GaN monocrystalline substrate. The group III nitride semiconductor multilayer structure 2 is formed by crystal growth on the major surface of the group III nitride semiconductor substrate 1.

The group III nitride semiconductor multilayer structure 2 includes a light emitting layer 10, an n-type semiconductor layered portion 11 and a p-type semiconductor layered portion 12. The n-type semiconductor layered portion 11 is disposed on a side of the light emitting layer 10 closer to the group III nitride semiconductor substrate 1, while the p-type semiconductor layered portion 12 is disposed on a side of the light emitting layer 10 closer to the p-type electrode 4. Thus, the light emitting layer 10 is held between the n-type semiconductor layered portion 11 and the p-type semiconductor layered portion 12, whereby a double heterojunction is provided. Electrons and positive holes are injected into the light emitting layer 10 from the n-type semiconductor layered portion 11 and the p-type semiconductor layered portion 12 respectively. The electrons and the positive holes are recombined in the light emitting layer 10, to emit light.

The n-type semiconductor layered portion 11 is formed by successively stacking an n-type GaN contact layer 13 (having a thickness of 2 μm, for example), an n-type AlGaN cladding layer 14 (having a thickness of not more than 1.5 μm such as a thickness of 1.0 μm, for example) and an n-type GaN guide layer 15 (having a thickness of 0.1 μm, for example) from the side closer to the group III nitride semiconductor substrate 1. On the other hand, the p-type semiconductor layered portion 12 is formed by successively stacking a p-type AlGaN electron blocking layer 16 (having a thickness of 20 nm, for example), a p-type GaN guide layer 17 (having a thickness of 0.1 μm, for example), a p-type AlGaN cladding layer 18 (having a thickness of not more than 1.5 μm such as a thickness of 0.4 μm, for example) and a p-type GaN contact layer 19 (having a thickness of 0.3 μm, for example) on the light emitting layer 10.

The n-type GaN contact layer 13 is a low-resistance layer. The p-type GaN contact layer 19 is a low-resistance layer for attaining ohmic contact with the p-type electrode 4. The n-type GaN contact layer 13 is made of an n-type semiconductor prepared by doping GaN with Si, for example, serving as an n-type dopant in a high doping concentration ($3 \times 10^{18}$ cm$^{-3}$, for example). The p-type GaN contact layer 19 is made of a p-type semiconductor prepared by doping GaN with Mg serving as a p-type dopant in a high doping concentration ($3 \times 10^{19}$ cm$^{-3}$, for example).

The n-type AlGaN cladding layer 14 and the p-type AlGaN cladding layer 18 provide a light confining effect confining the light emitted by the light emitting layer 10 therebetween. The n-type AlGaN cladding layer 14 is made of an n-type semiconductor prepared by doping AlGaN with Si, for example, serving as an n-type dopant (in a doping concentration of $1 \times 10^{18}$ cm$^{-3}$, for example). The p-type AlGaN cladding layer 18 is made of a p-type semiconductor prepared by doping AlGaN with Mg serving as a p-type dopant (in a doping concentration of $1 \times 10^{19}$ cm$^{-3}$, for example).

The n-type GaN guide layer 15 and the p-type GaN guide layer 17 are semiconductor layers providing a carrier confining effect for confining carriers (electrons and positive holes) in the light emitting layer 10. Thus, the efficiency of recombination of the electrons and the positive holes in the light emitting layer 10 is improved. The n-type GaN guide layer 15 is made of an n-type semiconductor prepared by doping GaN with Si, for example, serving as an n-type dopant (in a doping concentration of $1 \times 10^{18}$ cm$^{-3}$, for example), while the p-type GaN guide layer 17 is made of a p-type semiconductor prepared by doping GaN with Mg, for example, serving as a p-type dopant (in a doping concentration of $5 \times 10^{18}$ cm$^{-3}$, for example).

The p-type AlGaN electron blocking layer 16 is made of a p-type semiconductor prepared by doping AlGaN with Mg, for example, serving as a p-type dopant (in a doping concentration of $5 \times 10^{18}$ cm$^{-3}$, for example), and improves the efficiency of recombination of the electrons and the positive holes by preventing the electrons from flowing out of the light emitting layer 10.

The light emitting layer 10, having an MQW (multiple-quantum well) structure containing InGaN, for example, is a layer for emitting light by recombination of the electrons and the positive holes and amplifying the emitted light. More specifically, the light emitting layer 10 is formed by alternately repetitively stacking InGaN layers (each having a thickness of 3 nm, for example) and GaN layers (each having a thickness of 9 nm, for example) by a plurality of cycles. In this case, the In composition ratio in the InGaN layers is set to not less than 5%, so that the InGaN layers have relatively small band gaps and constitute quantum well layers. On the other hand, the GaN layers function as barrier layers having relatively large band gaps. The InGaN layers and the GaN layers are alternately repetitively stacked by two to seven cycles, for example, to constitute the light emitting layer 10 having the MQW structure. The emission wavelength is set to 400 nm to 550 nm, for example, by adjusting the In composition in the quantum well layers (InGaN layers).

The p-type semiconductor layered portion 12 is partially removed, to form the ridge stripe 20. More specifically, the p-type contact layer 19, the p-type AlGaN cladding layer 18 and the p-type GaN guide layer 17 are partially removed by etching, to form the ridge stripe 20 having a generally trapezoidal shape in cross sectional view. This ridge stripe 20 is formed on a position offset from the central position C in the device width direction toward the first side edge 33a by the offset distance d, as hereinabove described (see FIG. 2).

The group III nitride semiconductor multilayer structure 2 has a pair of end faces 21 and 22 formed by cleaving both ends of the ridge stripe 20 in the longitudinal direction. The pair of end faces 21 and 22 are cleavage planes parallel to each other. Thus, the n-type GaN guide layer 15, the light emitting layer 10 and the p-type GaN guide layer 17 form a Fabry-Perot resonator (laser resonator) with the end faces 21 and 22 serving as the resonator end faces. In other words, the light emitted in the light emitting layer 10 reciprocates between the resonator end faces 21 and 22, and is amplified by induced emission. The amplified light is partially extracted from the resonator end faces 21 and 22 as laser beams.

The n-type electrode 3 and the p-type electrode 4, made of an Al metal, for example, are in ohmic contact with the p-type contact layer 19 and the group III nitride semiconductor substrate 1 respectively. Insulating layers 6 covering the exposed surfaces of the n-type GaN guide layer 17 and the p-type AlGaN cladding layer 18 are so provided that the p-type electrode 4 is in contact with only the p-type GaN contact layer 19 provided on the top face of the ridge stripe 20. Thus, a current can be concentrated on the ridge stripe 20, thereby enabling efficient laser oscillation. In the semiconductor laser device 33, a portion located immediately under the ridge stripe 20 on which the current concentrates forms a light guide 25 for transmitting light. In other words, the light guide 25 is also orthogonal to the resonator end faces 21 and 22, similarly to the ridge stripe 20. The light guide 25 has a width of 1 μm to 2 μm, for example.

Insulating films 23 and 24 (see FIG. 4) different in reflectivity from each other are formed on the resonator end faces 21 and 22 respectively. More specifically, the insulating film 23 having small reflectivity is formed on the resonator end face 21, and the insulating film 24 having large reflectivity is formed on the opposite resonator end face 22. Therefore, the resonator end face 21 emits a larger quantity of laser output. In other words, the resonator end face 21 serves as a laser emitting end face in this semiconductor laser device 33.

According to this structure, light having the wavelength of 400 nm to 550 nm can be emitted by connecting the n-type electrode 3 and the p-type electrode 4 to a power source and injecting the electrons and the positive holes into the light emitting layer 10 from then-type semiconductor layered portion 11 and the p-type semiconductor layered portion 12 respectively thereby recombining the electrons and the positive holes in the light emitting layer 10. This light reciprocates between the resonator end faces 21 and 22 along the guide layers 15 and 17, and is amplified by induced emission. Thus, a larger quantity of laser output is extracted from the resonator end face 21 serving as the laser emitting end face.

A method of manufacturing the semiconductor laser device 33 is now described.

Figure 6:
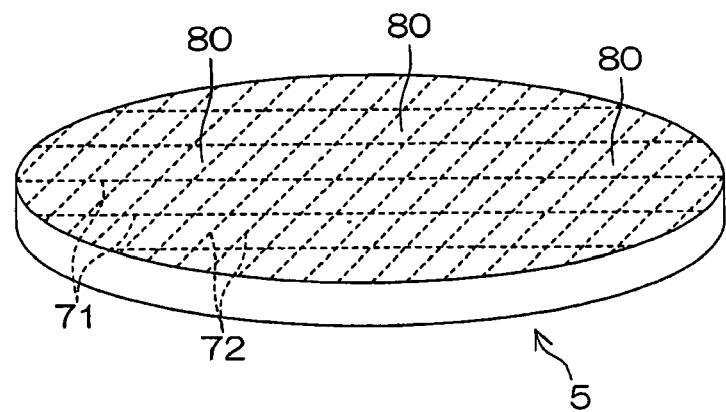
FIG. 6 is a perspective view schematically showing a wafer provided with individual devices.

In order to manufacture the semiconductor laser device 33, individual devices 80 each constituting the semiconductor laser device 33 are formed on a wafer 5 constituting the group III nitride semiconductor substrate 1 consisting of the GaN monocrystalline substrate, as schematically shown in FIG. 6.

More specifically, the n-type semiconductor layered portion 11, the light emitting layer 10 and the p-type semiconductor layered portion 12 are epitaxially grown on the wafer 5 (in the state of the GaN monocrystalline substrate) thereby forming the group III nitride semiconductor multilayer structure 2. After the formation of the group III nitride semiconductor multilayer structure 2, the ridge stripe 20 is formed by dry etching, for example. Then, the insulating layers 6, the p-type electrode 4 and the n-type electrode 3 are formed. Thus, the wafer 5 is obtained in the state provided with each individual device 80. In advance of the formation of the n-type electrode 3, grinding/polishing (chemical mechanical polishing, for example) is performed from the back surface of the wafer 5 in order to reduce the thickness thereof, if necessary. The thickness of the wafer 5 is so reduced that the device thickness from the substrate 1 to the group III nitride semiconductor multilayer structure 2 is not more than 90 μm, for example.

The respective individual devices 80 are formed in rectangular regions partitioned by tessellated cutting lines 71 and 72 (virtual lines) virtually formed on the wafer 5. The wafer 5 is divided into the respective individual devices 80 along these cutting lines 71 and 72. In other words, the wafer 5 is cleaved along the cutting lines 71 and 72, to cut out the individual devices 80.

Figure 7A:
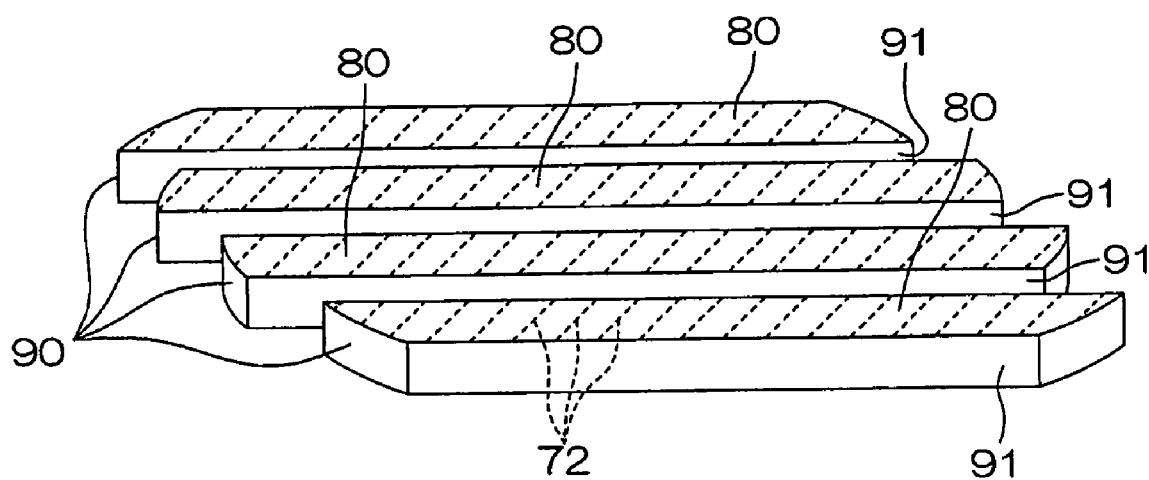
FIGS. 7A and 7B are schematic perspective views for illustrating a procedure of dividing the wafer into the individual devices.
Figure 7B:
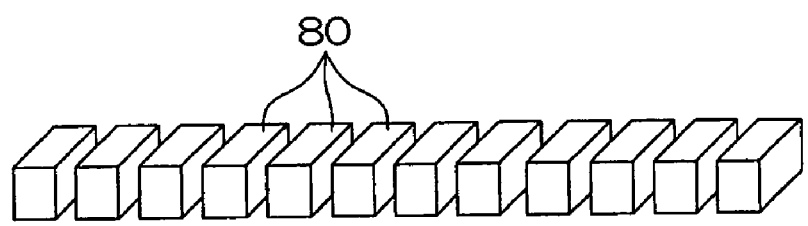

FIGS. 7A and 7B are schematic perspective views for illustrating an outline of the procedure for dividing the wafer 5 into the individual devices 80. First, the wafer 5 is cleaved along the cutting lines 71 orthogonal to the resonator direction. Thus, a plurality of bar bodies 90 are obtained, as shown in FIG. 7A. Both side surfaces 91 of each bar body 90 are defined by crystal planes for forming the resonator end faces 21 and 22. The aforementioned insulating films 23 and 24 (see FIG. 4) are formed on the side surfaces 91 of each bar body 90.

Then, each bar body 90 is cut along the cutting lines 72 parallel to the resonator direction. Thus, the bar body 90 is divided into the individual devices 80 and a plurality of chips are obtained, as shown in FIG. 7B.

Figure 8A:
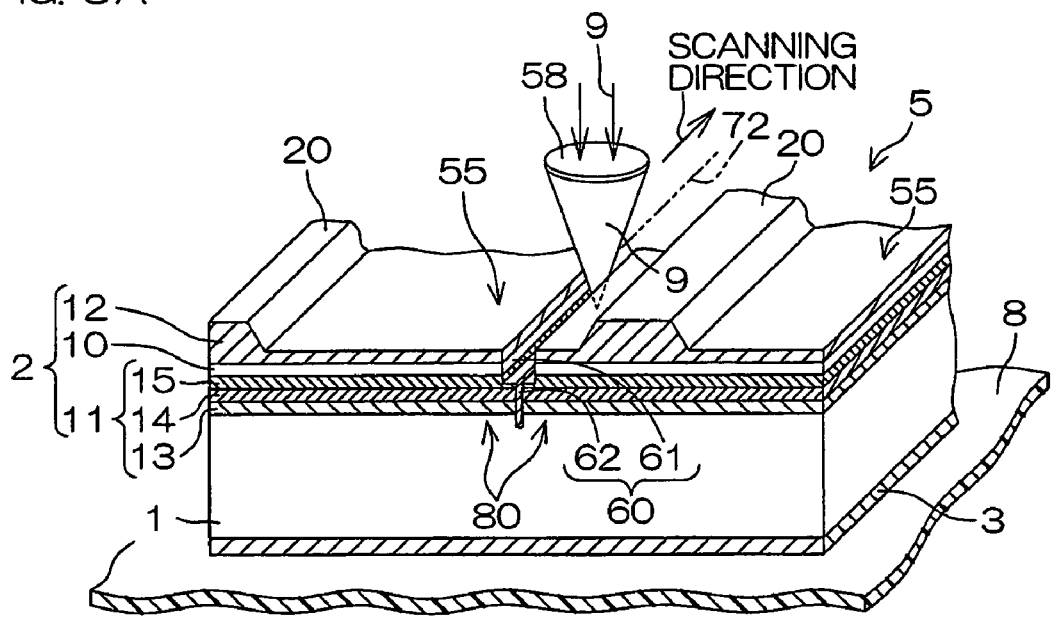
FIGS. 8A and 8B are schematic perspective views for illustrating a method of dividing the wafer into the individual devices.
Figure 8B:
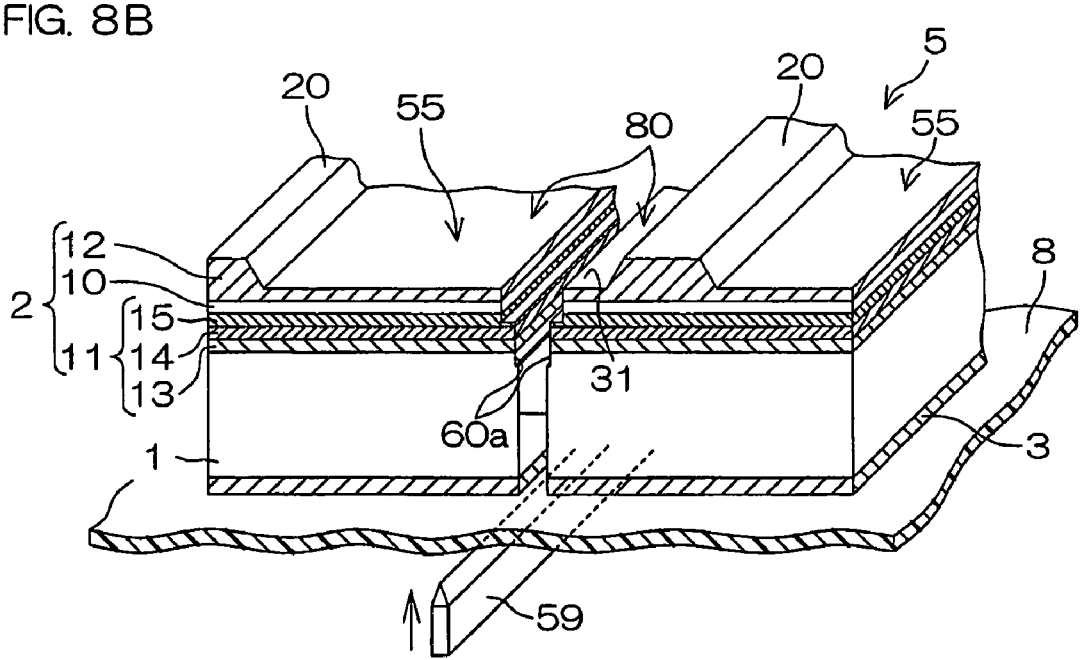

FIGS. 8A and 8B are schematic perspective views for illustrating a method of dividing the wafer 5 into the individual devices 80, showing a cutting step along one of the cutting lines 72 parallel to the resonator direction. Referring to FIGS. 8A and BB, illustration of the p-type electrode 4 and the insulating layers 6 is omitted. The p-type electrode 4 is not formed on the regions of the cutting lines 71 and 72, but selectively formed on a device surface region inside the cutting lines 71 and 72, as described later.

First, a dividing guide groove 60 is formed along the cutting line 72, as shown in FIG. 8A. The cutting line 72 is previously set to ensure the wire bonding region 55 between the ridge stripe 20 and the first side edge 33a of the semiconductor laser device 33. In other words, the cutting line 72 is so set that the ridge stripe 20 is offset from the central position C (see FIG. 2) between the same and the cutting line 72 adjacent thereto by the offset distance d (see FIG. 2).

The dividing guide groove 60 is formed by a wide first groove 61 along the cutting line 72 and a narrow second groove 62 further dug from the bottom surface of the first groove 61. The first groove 61 is formed by dry etching, after the formation of the p-type electrode 4 and before the formation of the n-type electrode 3 (after the formation of the p-type electrode 4 and before grinding/polishing of the back surface when the back surface is ground/polished). The first groove 61 is formed to have a depth reaching the n-type semiconductor layered portion 11, for example. The p-type electrode 4 is previously formed by vapor deposition, for example, in a pattern having a zonal opening 4a wider than the first groove 61 and along the cutting line 72 (see FIG. 5).

The second groove 62 is formed with a laser be a machine, for example, after the formation of the n-type electrode 4. More specifically, the wafer 5 including the plurality of individual devices 80 is first applied to a support sheet 8. This support sheet 8 is an adhesive sheet for preventing the individual devices 80 from scattering when the individual devices 80 are cut out of the wafer 5.

The wafer 5 is supported by the support sheet 8 in an upwardly directed state of opposing the surface (on the side closer to the n-type electrode 3) opposite to the group III nitride semiconductor multilayer structure 2 to the support sheet 8.

Then, the second groove 62 is formed with the laser beam machine, on the bottom surface portion of the first groove 61 in the group III nitride semiconductor multilayer structure 2 along the cutting line 72. The laser beam machine includes a laser beam emitting unit, a laser irradiation head including a condensing lens 58 condensing a laser beam emitted from the laser beam emitting unit and an X-Y stage mechanism, although the detailed structure thereof is not shown. FIG. 8A shows only the condensing lens 58 among these elements.

A YAG laser or an excimer laser, for example, can be employed as the laser beam emitting unit. The X-Y stage mechanism includes a stage holding the wafer 5 through the support sheet 8 and a moving mechanism for two-dimensionally moving this stage in two directions X and Y (horizontal directions, for example) orthogonal to each other. The X-Y stage mechanism may further include a mechanism for moving the stage along a direction Z (vertical direction, for example) for approaching to/separating from the condensing lens 58, if necessary. The condensing lens 58 can condense a laser beam 9, and the focal length thereof may be rendered adjustable, if necessary. The distance between the condensing lens 58 and the wafer 5 may be adjusted by approximating/separating the condensing lens 58 to/from the stage of the X-Y stage mechanism, or by approximating/separating the stage of the X-Y stage mechanism to/from the condensing lens 58. Thus, the positional relation between the condensing point of the condensing lens 58 and the wafer 5 can be adjusted. This positional relation can also be adjusted by adjusting the focal length of the condensing lens 58, as a matter of course.

The laser beam machine having the aforementioned structure is employed for scanning the wafer 5 with the laser beam 9. More specifically, the laser beam 9 scans the wafer 5 along the cutting line 72, to form the second groove 62 on the bottom surface portion of the first groove 61. Thus, the dividing guide groove 60 is formed by the first and second grooves 61 and 62.

In the scanning process, the laser beam 9 may be regularly applied, or may be intermittently applied by turning the laser beam emitting unit on/off.

On the position irradiated with the laser beam 9, the laser beam 9 is condensed on the surface of the group III nitride semiconductor multilayer structure 2, to cause multiphoton absorption on the condensing point. The condensing point is so scanned as to form the second groove 62 on a boundary region of each individual device 80 along the cutting line 72. The second groove 62 is continuously formed when the laser beam 9 is regularly applied in the scanning process, while the second groove 62 is divided in a perforated manner at prescribed intervals in the scanning direction when the laser beam 9 is intermittently applied in the scanning process. FIG. 8A shows the second groove 62 having a continuous shape.

The depth of the second groove 62 is about 10 µm, for example. In this case, the dividing guide groove 60 reaches the group III nitride semiconductor substrate 1 through the n-type AlGaN cladding layer 14 and the n-type GaN contact layer 13.

After the dividing guide groove 60 is formed in the aforementioned manner, external force is applied to the wafer 5 to divide the wafer 5, as shown in FIG. 8B (dividing step). More specifically, a blade 59 is applied from the side of the support sheet 8 along the dividing guide groove 60, and external stress (external force in a direction perpendicular to the major surface of the wafer 5) is applied to the wafer 5. Thus, the wafer 5 is cleaved and divided due to cracking from the dividing guide groove 60.

As hereinabove described, the wafer 5 is first divided into the plurality of bar bodies 90 (see FIG. 7A) along the cutting lines 71 perpendicular to the resonator direction. After the formation of the aforementioned insulating films 23 and 24 as reflecting films, the plurality of bar bodies 90 are divided along the cutting lines 72 parallel to the resonator direction (see FIG. 7B). Thus, the plurality of individual devices 80 each having the same size as the semiconductor laser device 33 are obtained from the wafer 5.

Figure 9:
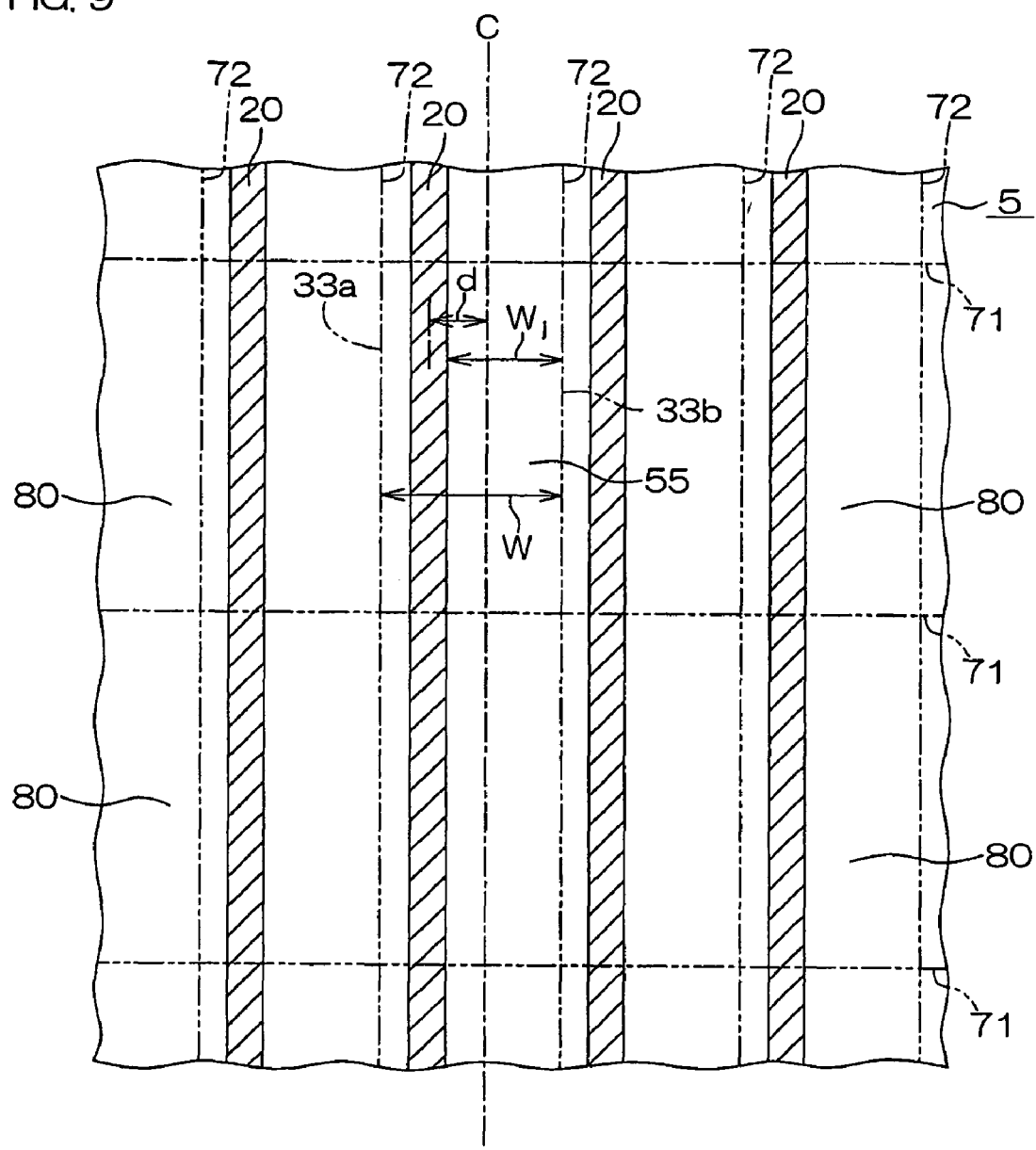
FIG. 9 is a schematic plan view for illustrating the positional relation between cutting lines and ridge stripes (laser resonators).

FIG. 9 is a schematic plan view for illustrating the positional relation between the cutting lines 71 and 72 and ridge stripes 20 (laser resonators). One ridge stripe 20 (shown with slant lines for the purpose of clarification) is formed between each adjacent pair of cutting lines 72. The ridge stripe 20 is offset from the central position (central position in the device width direction) C between each adjacent pair of cutting lines 72 toward one of the cutting lines 72 by the distance d. In other words, the cutting lines 72 are set to be in this positional relation. When the wafer 5 is cut along the cutting lines 72, therefore, each ridge stripe 20 is arranged on the position offset from the central position C in the device width direction toward the first side edge 33a of the device by the distance d.

As shown in FIG. 2, dividing groove traces 60a corresponding to dividing grooves 60 are formed on both side edges 33a and 33b of the semiconductor laser device 33 separated and obtained from the wafer 5. A substantial device thickness in the step of dividing the wafer 5 corresponds to a thickness h (hereinafter referred to as "substantial device thickness h") excluding the dividing groove traces 60a. In order to obtain excellent resonator end faces 21 and 22 by cleaving the wafer 5 along the cutting lines 71 orthogonal to the resonator direction, the relation between the substantial device thickness h and the device width W preferably satisfies $W \geq 1.4 h$. Particularly when the device width W is at a small value of $W \leq 150$ µm, for example, the relation is preferably set to $W \geq 1.4 h$.

When the chip size is reduced, the yield of chips obtainable per unit area of the wafer 5 can be increased, to advantageously reduce the cost. In this case, however, it is difficult to cleave the wafer 5, and excellent resonator end faces 21 and 22 are hard to obtain.

Therefore, the inventor of the present invention prepared bar-shaped substrates having various widths (device widths W) from a wafer having a thickness of 90 µm and formed dividing guide grooves having various depths (i.e., various substantial device thicknesses h) in the bar-shaped substrates with a laser beam machine, to verify whether or not the substrates were excellently cleavable (breakable). The results are as follows:

Substantial device thickness of 80 µm, device width of 80 µm, W/h=1.00 . . . unbreakable Substantial device thickness of 80 µm, device width of 100 µm, W/h=1.25 . . . unbreakable Substantial device thickness of 80 µm, device width of 120 µm, W/h=1.50 . . . breakable Substantial device thickness of 70 µm, device width of 80 µm, W/h=1.14 . . . unbreakable Substantial device thickness of 70 µm, device width of 100 µm, W/h=1.43 . . . breakable Substantial device thickness of 60 µm, device width of 80 µm, W/h=1.33 . . . unbreakable Substantial device thickness of 60 µm, device width of 100 µm, W/h=1.67 . . . breakable From these results, it is understood that the wafer 5 can be excellently cleaved and the resonator end faces 21 and 22 consisting of cleavage planes can be formed when the relation W≧1.4 h holds between the substantial device thickness h and the device width W.

It has also been recognized that the yield is deteriorated if the substantial device thickness h is not less than 100 µm. Therefore, the substantial device thickness h is preferably set to less than 100 µm.

In the semiconductor laser device 33 according to this embodiment, as hereinabove described, the ridge stripe 20 (laser resonator) is arranged to be offset from the central position C in the device width direction toward the first side edge 33a by the distance d. Thus, the wire bonding region 55 having the width $W_j$ is formed on the upper surface of the device between the ridge stripe 20 and the second side edge 33b. When the bonding wire 46 for connecting the semiconductor laser device 33 with the p-type electrode 4 is bonded to the wire bonding region 55, therefore, breakage of the resonator structure formed on the portion of the ridge stripe 20 can be suppressed or prevented.

When the semiconductor laser device 33 is die-bonded to the metal wiring layer 51 of the submount 32, further, the semiconductor laser device 33 can be easily handled and excellently die-bonded. More specifically, the semiconductor laser device 33 can be held for handling thereof with a suction head of an automatic mounting apparatus by sucking the central region of the upper surface thereof while avoiding the region of the laser resonator. Therefore, the device can be stably held, and the suction head can be inhibited from damaging the resonator structure. When the semiconductor laser device 33 is pressed against the metal wiring layer 51 to be die-bonded, the central region of the upper surface thereof can be pressed against the submount 32 while avoiding the resonator region. Therefore, pressing force can be uniformly supplied to the overall device, whereby the die bonding can be excellently performed, and the resonator structure can be prevented from damage in this die bonding.

Figure 10:
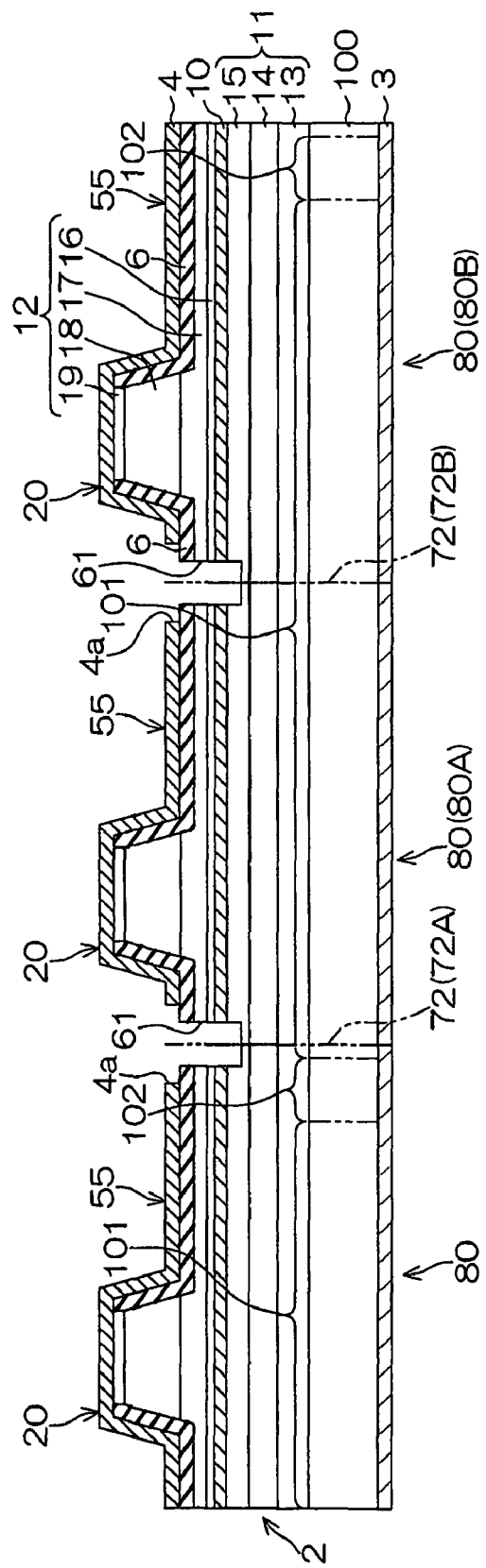
FIG. 10 is a schematic sectional view for illustrating the structure of a semiconductor laser device according to a second embodiment of the present invention.

FIG. 10 is a schematic sectional view for illustrating the structure of a semiconductor laser device according to a second embodiment of the present invention. According to this embodiment, a group III nitride semiconductor substrate 100 prepared by epitaxial lateral overgrowth (ELO) of group III nitride semiconductors is employed, in place of the substrate 1 consisting of the GaN monocrystalline substrate. A method described in US2004/0164308 A1, for example, can be employed for preparing a group III nitride semiconductor substrate through ELO. This group III nitride semiconductor substrate 100 includes low dislocation density regions 101 each having a relatively small dislocation density and high dislocation density regions 102 each having a large number of dislocations. The high dislocation density regions 102 are a plurality of zonal regions distributed to form a striped pattern parallel to the longitudinal direction (i.e., a resonator direction) of ridge stripes 20, and the zonal low dislocation density regions 101 are located therebetween.

A group III nitride semiconductor multilayer structure 2 is formed on the group III nitride semiconductor substrate 100 by epitaxy. The group III nitride semiconductor multilayer structure 2, grown while inheriting dislocations from the group III nitride semiconductor 100, has low dislocation densities on the low dislocation density regions 101 and high dislocation densities on the high dislocation density regions 102. Therefore, the ridge stripes 20 (laser resonators) are formed to be located on regions corresponding to the low dislocation density regions 101. In other words, the ridge stripes 20 are formed on the zonal low dislocation density regions 101 parallelly to the longitudinal direction of the low dislocation density regions 101.

Figure 11A:
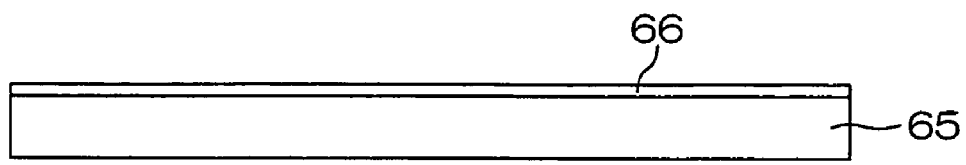
FIGS. 11A, 11B and 11C are sectional views for illustrating steps of manufacturing a group III nitride semiconductor substrate having low dislocation density regions and high dislocation density regions.
Figure 11B:
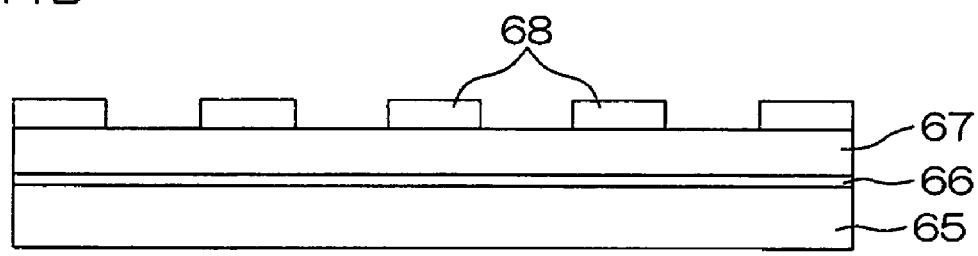
Figure 11C:
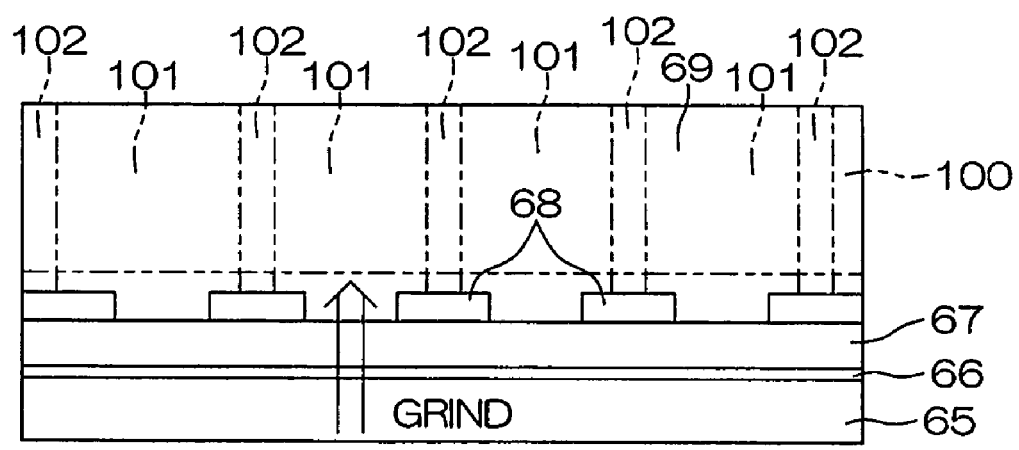

In order to prepare the group III nitride semiconductor substrate 100, steps shown in FIGS. 11A, 11B and 11C can be applied, for example. A buffer layer 66 is formed on an underlayer substrate 65 (FIG. 11A), and an underlayer 67 made of a group III nitride semiconductor is formed on the buffer layer 66 (FIG. 11B). Further, masks 68 are formed on the surface of the under layer 67 by photolithography in a periodic striped pattern (FIG. 11B). Then, a group III nitride semiconductor layer 69 (FIG. 11C) is formed by crystal growth (ELO) from portions of the underlayer 67 exposed from the masks 68. This group III nitride semiconductor layer 69 may be employed as the aforementioned group III nitride semiconductor substrate 100. In other words, the group III nitride semiconductor layer 69 may be exposed by removing the underlayer substrate 65, the buffer layer 66 and the masks 68 by grinding/polishing from the back surface after the growth of the group III nitride semiconductor multilayer structure 2 so that the left group III nitride semiconductor layer 69 is employed as the group III nitride semiconductor substrate 100, for example. A substrate of sapphire, silicon carbide or aluminum nitride may be employed as the underlayer substrate 65. A group III nitride semiconductor layer such as a GaN layer may be formed as the underlayer 67. The masks 68 can be made of silicon oxide, for example.

In the group III nitride semiconductor layer 69, the high dislocation density regions 102 are formed on regions above the masks 68, and the low dislocation density regions 101 are formed above regions located between the adjacent ones of the masks 68. This is because epitaxial vertical overgrowth of the group III nitride semiconductor is first performed from the portions, serving as seed crystals, of the underlayer 67 exposed from the masks 68, and epitaxial lateral overgrowth of the group III nitride semiconductor is thereafter performed to cover the masks 68. In other words, vertical dislocations inherited from the underlayer 67 are laterally bent due to the epitaxial lateral overgrowth, and these lateral dislocations collide with one another on the regions above the masks 68. Therefore, the dislocations concentrate on the regions above the masks 68, and these regions form the high dislocation density regions 102.

Figure 12:
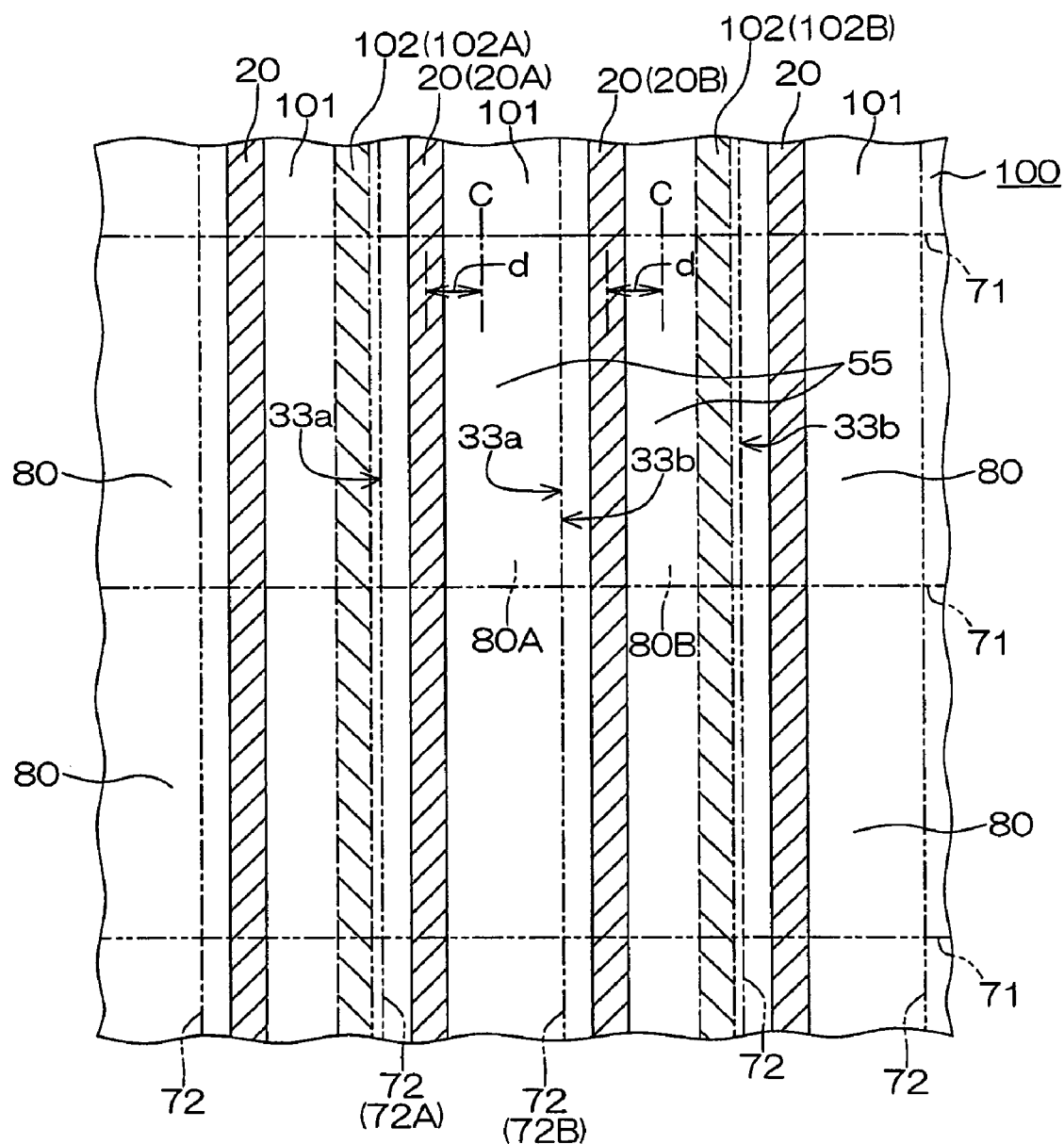
FIG. 12 is a schematic plan view for illustrating arrangement of individual devices on the group III nitride semiconductor substrate.

FIG. 12 is a schematic plan view for illustrating arrangement of individual devices 80 on the group III nitride semiconductor substrate 100. The zonal high dislocation density regions 102 (shown with slant lines for the purpose of clarification) are periodically present on the group III nitride semiconductor substrate 100 in a cycle corresponding to that of the mask 68. Referring to FIG. 12, two ridge stripes 20A and 20B (laser resonators) are formed on a region of one cycle of the high dislocation density regions 102. More specifically, the two ridge stripes 20A and 20B are formed parallelly to each other on a zonal low dislocation density region 101 located between adjacent zonal high dislocation density regions 102A and 102B. Two cutting lines 72A and 72B along the resonator direction are set in the low dislocation density region 101 located between the adjacent zonal high dislocation density regions 102A and 102B. The cutting line 72A is positioned between one ridge stripe 20A of the two ridge stripes and the zonal high dislocation density region 102A, while the cutting line 72B is positioned between the two ridge stripes 20A and 20B. An individual device 80A including the ridge stripe 20A includes only the low dislocation density region 101 therein, while an individual device 80B including the ridge stripe 20B includes both of the low dislocation density region 101 and the high dislocation density region 102 therein.

Similarly to the case of the aforementioned first embodiment, each ridge stripe 20 (20A or 20B) is offset from a central position C in a device width direction toward a first side edge 33a by a distance d. In other words, the cutting lines 72 are set to provide such positional relation. The offset direction is so set that the ridge stripe 20 is positioned closer to the first side edge 33a and the high dislocation density region 102 is positioned closer to a second side edge 33b in the individual device 80B including the high dislocation density region 102 therein. In other words, the ridge stripe 20 is offset toward a side opposite to the high dislocation density region 102.

According to this structure, efficient laser oscillation can be caused by forming a resonator structure on the low dislocation density region 101 while ensuring a wire bonding region 55 through the high dislocation density region 102 in the individual device 80B including the high dislocation density region 102. The individual device 80A including only the low dislocation density region 101 is also capable of efficient laser oscillation, as a matter of course. In addition, a nitride semiconductor laser device having a small number of dislocations causing a leakage current can be obtained, and the life of the device can be improved.

Figure 13:
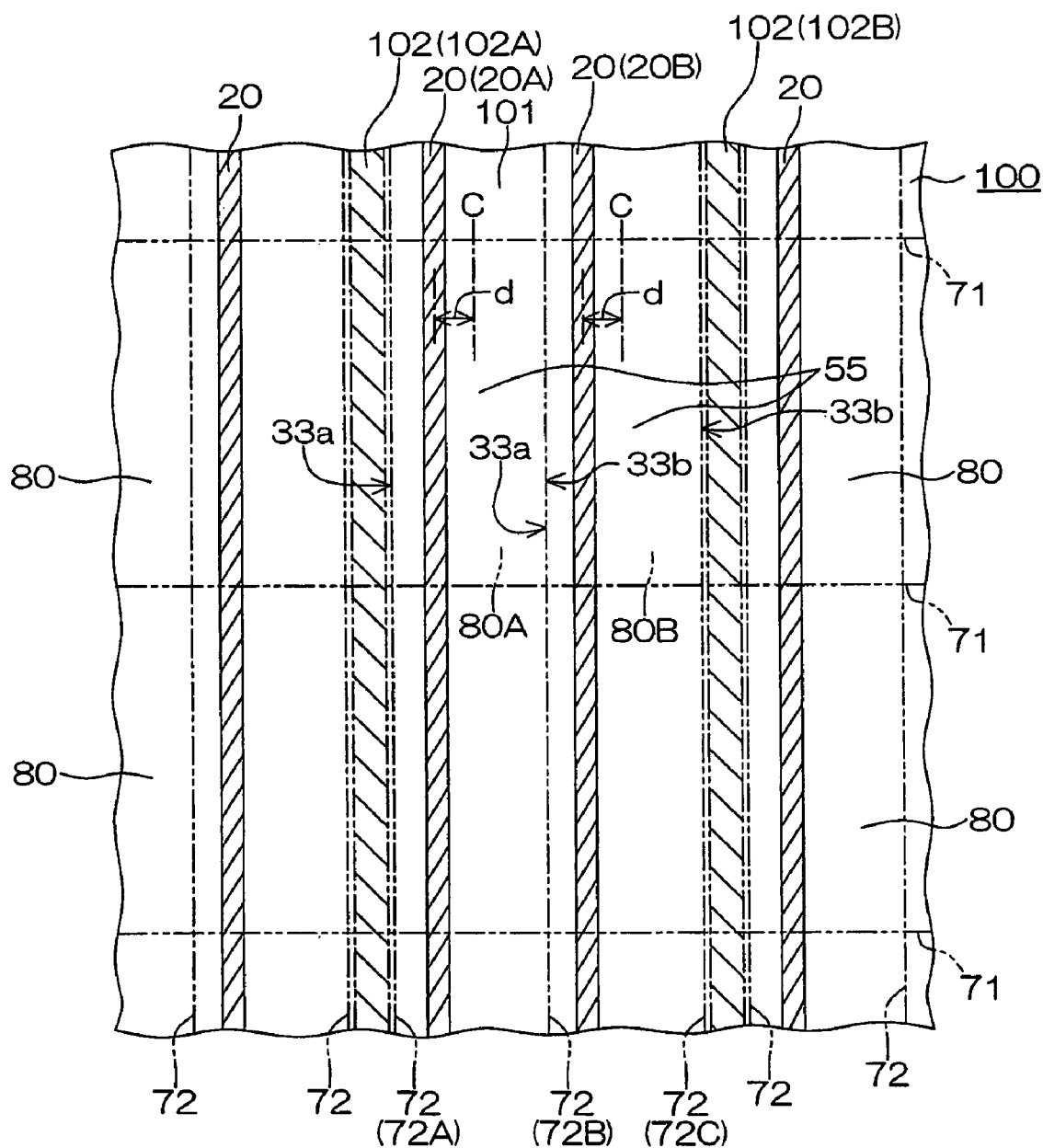
FIG. 13 is a schematic plan view for illustrating another arrangement of individual devices on the group III nitride semiconductor substrate.

FIG. 13 is a schematic plan view for illustrating another arrangement of the individual devices 80 on the group III nitride semiconductor substrate 100. Referring to FIG. 13, two ridge stripes 20A and 20B (laser resonators) are formed on a zonal low dislocation density region 101 located between each adjacent pair of zonal high dislocation density regions 102. Further, three cutting lines 72A, 72B and 72C along the resonator direction are set in a low dislocation density region 101 located between these adjacent zonal high dislocation density regions 102A and 102B. The first cutting line 72A is positioned between the ridge stripe 20A and the zonal high dislocation density region 102A, the second cutting line 72B is positioned between the two ridge stripes 20A and 20B, and the third cutting line 72C is positioned between the ridge stripe 20B and the zonal high dislocation density region 102B. Therefore, each of two individual devices 80A and 80B includes only the low dislocation density region 101 therein. Thus, a nitride semiconductor laser device having a small number of dislocations causing a leakage current can be obtained, and the life of the device can be improved.

Each ridge stripe 20 (20A or 20B) is offset from a central position C in a device width direction toward a first side edge 33a by a distance d. In other words, the cutting lines 72 are set to provide such positional relation. The offset direction, set toward the first cutting line 72A in FIG. 13, may alternatively be selected toward the third cutting line 72C.

Thus, a nitride semiconductor laser device including no high dislocation density region 102 in the chip is obtained in the example shown in FIG. 13. While the device width W is reduced in this case, a wire bonding region 55 can be ensured by offsetting the ridge stripe 20 from the central position C in the device width direction.

While the two embodiments of the present invention have been described, the present invention may be embodied in other ways. For example, while the semiconductor laser device 33 is mounted on the submount 32 in the semiconductor laser 30 according to the aforementioned embodiment, the semiconductor laser device may alternatively be directly bonded to the stem.

While the p-type electrode 4 is formed generally on the overall surface of the device in the aforementioned embodiment, the p-type electrode 4 may not be formed to generally cover the overall surface of the wire bonding region 55, but may be formed on a region where the bonding wire 46 is bonded, such as a region around the center in the resonator direction, for example. Further, a pad electrode may be made of a metal different from the material for the p-type electrode 4 bonded to the group III nitride semiconductor multilayer structure 2.

While the second groove 62 of the dividing guide groove 60 is formed with the laser beam machine in the aforementioned embodiment, mechanical working such as scribing with a diamond cutter or groove formation with a dicer may alternatively be applied for forming the dividing guide groove.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-340212 filed with the Japanese Patent Office on Dec. 28, 2007, the entire disclosure of which is incorporated herein by reference.

What is claimed is:

1. A nitride semiconductor laser device formed by growing a group III nitride semiconductor multilayer structure on a substrate, wherein
   the group III nitride semiconductor multilayer structure has a laser resonator including an n-type semiconductor layer, a p-type semiconductor layer and a light emitting layer held between the n-type semiconductor layer and the p-type semiconductor layer,
   the laser resonator is arranged to be offset from a center with respect to a device width direction orthogonal to a resonator direction toward one side edge of the device,
   a wire bonding region having a width of not less than twice a diameter of an electrode wire to be bonded to the device is formed between the laser resonator and the other side edge of the device, and
   a substrate dividing groove trace is formed on a side edge of the device, and a device thickness h of the remaining portion excluding the substrate dividing groove trace and a device width W in the direction orthogonal to the resonator direction satisfy $W \geq 1.4\,h$.

2. The nitride semiconductor laser device according to claim 1, wherein
   the laser resonator is offset from the center in the device width direction toward the one side edge of the device by a distance of not less than the diameter of the electrode wire.

3. The nitride semiconductor laser device according to claim 1, wherein
   the substrate periodically has a region having a first dislocation density and a region having a second dislocation density lower than the first dislocation density on the surface, and
   the laser resonator is arranged on the region having the second dislocation density.

4. The nitride semiconductor laser device according to claim 1, wherein
   the substrate not yet divided into each device periodically has a region having a first dislocation density and a region having a second dislocation density lower than the first dislocation density on the surface, the laser resonator is arranged on the region having the second dislocation density, and the region having the first dislocation density is not included in the device.

5. The nitride semiconductor laser device according to claim 1, wherein a metallic pattern for bonding the electrode wire is formed on the center with respect to the device width direction orthogonal to the resonator direction.

6. A nitride semiconductor laser device formed by growing a group III nitride semiconductor multilayer structure on a substrate, wherein the group III nitride semiconductor multilayer structure has a laser resonator including an n-type semiconductor layer, a p-type semiconductor layer and a light emitting layer held between the n-type semiconductor layer and the p-type semiconductor layer, and a substrate dividing groove trace is formed on a side edge of the device, and a device thickness h of the remaining portion excluding the substrate dividing groove trace and a device width W in a direction orthogonal to a resonator direction satisfy $W \geq 1.4h$.

7. A method of manufacturing a nitride semiconductor laser device, including the steps of:

forming a group III nitride semiconductor multilayer structure having a laser resonator including an n-type semiconductor layer, a p-type semiconductor layer and a light emitting layer held between the n-type semiconductor layer and the p-type semiconductor layer on a substrate; and dividing the substrate so that the laser resonator is arranged to be offset from a center with respect to a device width direction orthogonal to a resonator direction toward one side edge of the device, and forming a wire bonding region having a width of not less than twice the diameter of an electrode wire to be bonded to the device between the laser resonator and the other side edge of the device, wherein the step of forming the wire bonding region includes the steps of:

forming a substrate dividing groove on the substrate so that a device thickness h of the remaining portion excluding a substrate dividing groove trace and a device width W in the direction orthogonal to the resonator direction satisfy $W \geq 1.4h$; and dividing the substrate along the substrate dividing groove.

8. The method of manufacturing a nitride semiconductor laser device according to claim 7, wherein the step of forming the wire bonding region includes a step of dividing the substrate so that the laser resonator is arranged to be offset from the center in the device width direction toward the one side edge of the device by a distance of not less than the diameter of the electrode wire.

9. The method of manufacturing a nitride semiconductor laser device according to claim 7, wherein the substrate periodically has a region having a first dislocation density and a region having a second dislocation density lower than the first dislocation density on the surface, and the laser resonator is arranged on the region having the second dislocation density.

10. The method of manufacturing a nitride semiconductor laser device according to claim 7, wherein the substrate not yet divided into each device periodically has a region having a first dislocation density and a region having a second dislocation density lower than the first dislocation density on the surface, the laser resonator is arranged on the region having the second dislocation density, and the substrate is so divided as not to include the region having the first dislocation density in the device.

11. The method of manufacturing a nitride semiconductor laser device according to claim 7, further including a step of forming a metallic pattern for bonding the electrode wire on the center related to the device width direction orthogonal to the resonator direction.

12. A method of manufacturing a nitride semiconductor laser device, including the steps of:

forming a group III nitride semiconductor multilayer structure having a laser resonator including an n-type semiconductor layer, a p-type semiconductor layer and a light emitting layer held between the n-type semiconductor layer and the p-type semiconductor layer on a substrate;

forming a substrate dividing groove on the substrate so that a device thickness h of the remaining portion excluding the substrate dividing groove and a device width W in a direction orthogonal to a resonator direction satisfy $W \geq 1.4h$; and dividing the substrate along the substrate dividing groove.

13. The method of manufacturing a nitride semiconductor laser device according to claim 12, wherein the substrate periodically has a region having a first dislocation density and a region having a second dislocation density lower than the first dislocation density on the surface, and the laser resonator is arranged on the region having the second dislocation density.

14. The method of manufacturing a nitride semiconductor laser device according to claim 12, wherein the substrate not yet divided into each device periodically has a region having a first dislocation density and a region having a second dislocation density lower than the first dislocation density on the surface, the laser resonator is arranged on the region having the second dislocation density, and the substrate is so divided as not to include the region having the first dislocation density in the device.

* * * * *